United States Patent
Hewitt et al.

(10) Patent No.: US 7,356,752 B2
(45) Date of Patent: Apr. 8, 2008

(54) ENHANCED TURBO PRODUCT CODES

(75) Inventors: Eric John Hewitt, Pullman, WA (US);
Bradley William Lindstrom, Pullman, WA (US); Peter Sean Ladow, Pullman, WA (US); Alan Robert Danielson, Moscow, ID (US)

(73) Assignee: Comtech Telecommunications Corp., Melville, NY (US)

( * ) Notice: Subject to any disclaimer, the term of this patent is extended or adjusted under 35 U.S.C. 154(b) by 735 days.

(21) Appl. No.: 09/808,884

(22) Filed: Mar. 14, 2001

(65) Prior Publication Data

US 2001/0050622 A1 Dec. 13, 2001

Related U.S. Application Data

(60) Provisional application No. 60/189,345, filed on Mar. 14, 2000.

(51) Int. Cl.
*H03M 13/00* (2006.01)
(52) U.S. Cl. .......................... 714/755; 714/756
(58) Field of Classification Search ............... 714/755, 714/756
See application file for complete search history.

(56) References Cited

U.S. PATENT DOCUMENTS

| | | | | |
|---|---|---|---|---|
| 4,295,218 A | 10/1981 | Tanner | ............ | 371/40 |
| 4,559,625 A | 12/1985 | Berlekamp et al. | ............ | 371/2 |
| 4,564,945 A * | 1/1986 | Glover et al. | ............ | 714/769 |
| 4,763,331 A | 8/1988 | Matsumoto | ............ | 371/37 |
| 4,796,260 A | 1/1989 | Schilling et al. | ............ | 371/39 |
| 4,821,290 A | 4/1989 | Hingorani et al. | ............ | 375/25 |
| 4,845,714 A | 7/1989 | Zook | ............ | 371/50 |
| 5,157,671 A | 10/1992 | Karplus | ............ | 371/43 |
| 5,351,246 A | 9/1994 | Blaum et al. | ............ | 371/10.1 |
| 5,369,652 A * | 11/1994 | Bailey et al. | ............ | 714/755 |
| 5,392,299 A * | 2/1995 | Rhines et al. | ............ | 714/756 |
| 5,406,570 A | 4/1995 | Berrou et al. | ............ | 371/43 |

(Continued)

FOREIGN PATENT DOCUMENTS

EP 0 625 829 A2 11/1994

OTHER PUBLICATIONS

R. Pyndiah et al., "Performance of Block Turbo Coded 16-QAM and 64-QAM Modulations," IEEE, 1995, pp. 1039-1043.

(Continued)

*Primary Examiner*—Joseph D. Torres
(74) *Attorney, Agent, or Firm*—Haverstock & Owens LLP

(57) ABSTRACT

A hyper encoder module encodes a block of data having a plurality of sub-blocks. Each sub-block includes a plurality of systematic block code codewords. A parity sub-block is added to the block. The parity sub-block is a first sub-block rotated by a predetermined number of bits. Each subsequent sub-block in the n-dimensional block is rotated by an appropriate number of bits and bit-wise XORed. An encoder method and apparatus which includes the hyper encoder module receives the block of data. A row of the block is immediately output and encoded by a first module according to a first encoding scheme. A column is encoded by a second module according to a second encoding scheme. A second set of encoded data is generated, iteratively updated and output by the second module. The hyper encoder module hyper-diagonally encodes the information bits as described above and then output.

13 Claims, 9 Drawing Sheets

U.S. PATENT DOCUMENTS

| | | | |
|---|---|---|---|
| 5,446,747 A | 8/1995 | Berrou | 371/45 |
| 5,499,254 A | 3/1996 | Ikekawa et al. | 371/43 |
| 5,541,955 A | 7/1996 | Jacobsmeyer | 375/222 |
| 5,559,506 A | 9/1996 | Leitch | 340/825.44 |
| 5,563,897 A | 10/1996 | Pyndiah et al. | 371/37.4 |
| 5,566,191 A | 10/1996 | Ohnishi et al. | 371/43 |
| 5,657,354 A | 8/1997 | Thesling, III et al. | 375/332 |
| 5,684,811 A | 11/1997 | Doran | 371/43 |
| 5,703,911 A | 12/1997 | Lin et al. | 375/341 |
| 5,708,667 A | 1/1998 | Hayashi | 371/37.4 |
| 5,719,884 A | 2/1998 | Roth et al. | 371/37.4 |
| 5,721,745 A | 2/1998 | Hladik et al. | 371/43 |
| 5,721,746 A | 2/1998 | Hladik et al. | 371/43 |
| 5,729,560 A | 3/1998 | Hagenauer et al. | 371/43.1 |
| 5,761,248 A | 6/1998 | Hagenauer et al. | 375/340 |
| 5,787,127 A | 7/1998 | Ono et al. | 375/341 |
| 5,787,239 A | 7/1998 | Horie et al. | 395/114 |
| 5,802,116 A | 9/1998 | Baker et al. | 375/341 |
| 5,841,818 A | 11/1998 | Lin et al. | 375/341 |
| 5,898,698 A | 4/1999 | Bross | 371/2.1 |
| 5,901,182 A | 5/1999 | Kot | 375/341 |
| 5,907,582 A | 5/1999 | Yi | 375/259 |
| 5,930,272 A | 7/1999 | Thesling | 371/37.01 |
| 5,999,111 A | 12/1999 | Park et al. | 341/67 |
| 6,104,758 A | 8/2000 | Kaku et al. | 375/265 |
| 6,145,111 A | 11/2000 | Crozier et al. | 714/755 |
| 6,188,797 B1 | 2/2001 | Moledina et al. | 382/246 |
| 6,367,047 B1* | 4/2002 | McAuliffe et al. | 714/755 |
| 6,421,804 B1 | 7/2002 | Lee | 714/755 |
| 6,460,162 B1 | 10/2002 | Buda et al. | 714/807 |
| 6,484,283 B2 | 11/2002 | Stephen et al. | 714/786 |
| 6,499,128 B1 | 12/2002 | Gerlach et al. | 714/755 |
| 6,526,538 B1 | 2/2003 | Hewitt | 714/780 |
| 6,539,367 B1 | 3/2003 | Blanksby et al. | 706/14 |
| 6,594,318 B1 | 7/2003 | Sindhushayana | 375/262 |
| 6,795,507 B1 | 9/2004 | Xin et al. | 375/265 |
| 2002/0101915 A1 | 8/2002 | Zhang et al. | 375/222 |
| 2002/0150167 A1 | 10/2002 | Demjanenko et al. | 375/259 |

OTHER PUBLICATIONS

A. Picart & R. Pyndiah, "Performance of Turbo-Decoded Product Codes Used in Multilevel Coding," IEEE, 1996, pp. 107-111.

R. Pyndiah, "Near-Optimum Decoding of Product Codes: Block Turbo Codes," IEEE Transactions on Communications, vol. 46, No. 8, Aug. 1998, pp. 1003-1010.

S. Dolinar et al., "Code Performance as a Function of Block Size," TMO Progress Report 42-133, May 1998, pp. 1-23.

D. Divsalar & F. Pollara, "Multiple Turbo Codes for Deep-Space Communications," TDA Progress Report 42-121, May 1995, pp. 66-77.

D. Divsalar & F. Pollara, "Turbo Codes for Deep-Space Communications," TDA Progress Report 42-120, Feb. 1995, pp. 29-39.

D. Divsalar & F. Pollara, "On the Design of Turbo Codes," TDA Progress Report 42-123, Nov. 1995, pp. 99-121.

G. Battail et al., "Pseudo-Random Recursive Convolutional Coding For Near-Capacity Performance," IEEE, 1993, pp. 23-27.

M. Moher, "Decoding Via Cross-Entropy Minimization," IEEE, 1993, pp. 809-813.

S. Benedetto et al.,"Soft-Output Decoding Algorithms for Continuous Decoding of Parallel Concatenated Convolutional Codes," IEEE, 1996, pp. 112-117.

P. Hoeher, "Advances in Soft-Output Decoding," IEEE, 1993, pp. 793-797.

C. Berrou et al., "A Low Complexity Soft-Output Viterbi Decoder Architecture," IEEE, 1993, pp. 737-740.

J. Hagenauer, "Decoding of Binary Codes with Analog Networks," ITW, Feb. 1998, pp. 13-14.

N. Seshadri & P. Hoeher, "On Post-Decision Symbol-Reliability Generation," IEEE, 1993, pp. 741-745.

D. Costello Jr. & H. Cabral, "The Effect of Turbo Codes on Figure 1," ITW, Feb. 1998, pp. 41-42.

D. Divsalar & F. Pollara, "Turbo Codes for PCS Applications," (no date or publisher listed).

C. Berrou et al., "An IC for Turbo-Codes Encoding and Decoding," IEEE, 1995, pp. 90-91.

A. J. Viterbi et al.,"Perspectives on Interleaved Concatenated Codes with Iterative Soft-Output Decoding," International Symposium on Turbo Codes, 1997, pp. 47-54.

C. Wang, "Asymptotic Performances of Nonrepetitive & Repetitive Turbo Codes," IEEE, 1997, pp. 1-6.

A. Hunt and S. Crozier, "Hyper-Codes: High-Performance Low-Complexity Error-Correcting Codes," (no date or publisher listed).

C. Wang, "On the Performance of Turbo Codes," IEEE, 1998, pp. 987-992.

S. Benedetto et al, "Analysis, Design, and Iterative Decoding of Double Serially Concatenated Codes with Interleavers," IEEE Journal on Selected Areas in Communications, vol. 16, No. 2, Feb. 1998, pp. 231-244.

O. Acikel & W. Ryan, "Punctured Turbo Codes for BPSK/QPSK Channels," (no publisher listed), Mar. 1999, pp. 1-30.

O. Acikel, "Implementation Issues for High Rate Turbo Codes on BPSK/QPSK Channels," (no publisher listed), Mar. 1999, pp. 1-12.

J. Hagenauer, "Iterative Decoding of Binary Block and Convolutional Codes," IEEE Transactions on Information Theory, vol. 42, No. 2, Mar. 1996, pp. 429-445.

L. Bahl et al., "Optimal Decoding of Linear Codes for Minimizing Symbol Error Rate," IEEE Transactions on Information Theory, Jan. 1972, pp. 284-287, International Symposium on Information Theory, Asilomar, CA.

P. Elias, "Error-Free Coding," IRE Transactions on Information Theory, 1954, pp. 29-37.

S. Reddy & J. Robinson, "Random Error and Burst Correction by Iterated Codes," IEEE 1970, pp. 170-181.

D. Chase, "A Class of Algorithms for Decoding Block Codes with Channel Measurement Information," IEEE Transactions on Information Theory Jan. 1972, pp. 170-181.

P. Adde et al., "Design and performance of a product code turbo encoding-decoding prototype," pp. 214-219. Ann Telecommun., vol. S4, No. 3-4, 1999.

A. Goalic et al., "Real-Time Turbo-Decoding of Product Codes on a Digital Signal Processor," Mar. 11, 1997, pp. 624-628.

L. Tolhuizen et al., "Union bounds on the performance of product codes," ISIT 1998, p. 267.

L. Tolhuizen & C.P.M.G. Baggen, "On the weight enumerator of product codes," Discrete Mathematics, 1992, vol. 106, No. 107 pp. 483-488.

F. Chiaraluce & R. Garello, "On the Asymptotic Performance of Hamming Product Codes", ISCTA 01, pp. 1-6, Jul. 15, 2001.

H. Nickl,et al., "Approaching Shannon's capacity limit by 0.27 dB using Hamming codes in a 'turbo'- decoding scheme," ISIT 1997.

J. Lodge et al., "Separable Map "Filters" For The Decoding Of Product and Concatenated Codes," IEEE, 1993, pp. 1740-1745.

J. Hagenauer & P. Hoeher, "A Viterbi Algorithm with Soft-Decision Outputs and its Applications," IEEE, 1989, pp. 1680-1686.

S. Hirasawa et al., "Modified Product Codes," IEEE 1984, vol. 1T-30, No. 2, pp. 299-306.

G. Ungerboeck, "Channel Coding with Multilevel/ Phase Signals," IEEE Transactions on Information Theory vol. IT-28, No. 1, Jan. 1982.

S. Cambanis & M. Habib, "Finite Sampling Approximations for non-Band-Limited Signals," IEEE, vol. 25, No. 5, Jul. 1981 p. 67.

U. Wachsmann et al., "Multilevel Codes: Theoretical Concepts and Practical Design Rules," IEEE, vol. 25, No. 5, Jul. 1999, pp. 1361-1391.

G. Caire et al., "Bit-Interleaved Coded Modulation," IEEE, vol. 44, No. 3 May 1998, pp. 927-945.

O. Acikel & W. Ryan, "High Rate Turbo Codes for BPSK/QPSK Channels," IEEE, 1998, pp. 422-427.

W. Blackert & S. Wilson, "Turbo Trellis Coded Modulation," University of Virginia[undated][no page Nos.].

J. Hagenauer, P. Hoeher, "Algorithm with Soft-Decision Outputs and its Applications," IEEE 1989 pp. 1680-1686.

C. Berrou, "Near Optimum Error Correcting Coding and Decoding: Turbo-Codes," IEEE, vol. 44, No. 10, Oct. 1996, pp. 1261-1271.

Eric Hewitt, "Turbo Product Codes for LDMS",1999 IEEE, Advanced Hardware Architectures, Inc., pp. 107-111.

Jian Wang et al., "Performance Bounds on Product Codes with Hyper-Diagonal Parity", XP-001034704, Mar. 15, 2000, pp. WP7/1-6.

Diagnosing On-Card Error Checking and Correcting Operations Using Latched Syndrome Data, IBM Technical Disclosure Bulletin, Oct. 1989, No. NA891026.

"Single-Bit Correct, Double-Bit Error Checking/Correction Scheme," IBM Technical Disclosure Bulletin, May 1994, No. NN9405101.

Pascale Ferry et al., Turbo-Decoder Synchronisation Procedure. Application to the CAS5093 Integrated Circuit, ICECS '96, pp. 168-171.

* cited by examiner

|0|1|2|3|4|5|6|7|
|7|0|1|2|3|4|5|6|
|6|7|0|1|2|3|4|5|
|5|6|7|0|1|2|3|4|
|4|5|6|7|0|1|2|3|
|3|4|5|6|7|0|1|2|
|2|3|4|5|6|7|0|1|
|h1|h2|h3|h4|h5|h6|h7|h0|

8x7 Hyper

|0|1|2|3|4|5|6|7|8|9|10|11|12|13|14|15|
|15|0|1|2|3|4|5|6|7|8|9|10|11|12|13|14|
|14|15|0|1|2|3|4|5|6|7|8|9|10|11|12|13|
|13|14|15|0|1|2|3|4|5|6|7|8|9|10|11|12|
|12|13|14|15|0|1|2|3|6|5|6|7|8|9|10|11|
|h11|h12|h13|h14|h15|h0|h1|h2|h3|h4|h5|h6|h7|h8|h9|h10|

16x5 Hyper

|0|1|2|3|
|3|0|1|2|
|2|3|0|1|
|1|2|3|0|
|0|1|2|3|
|3|0|1|2|
|2|3|0|1|
|1|2|3|0|
|0|1|2|3|
|h1|h0|h1|h2|

4X9 Hyper

| 0  | 1  | 2  | 3  |
|----|----|----|----|
| 4  | 5  | 6  | 7  |
| 8  | 9  | 10 | 11 |
| 12 | 13 | 14 | 15 |

| 15 | 12 | 13 | 14 |
|----|----|----|----|
| 3  | 0  | 1  | 2  |
| 7  | 4  | 5  | 6  |
| 11 | 8  | 9  | 10 |

| 10 | 11 | 8  | 9  |
|----|----|----|----|
| 14 | 15 | 12 | 13 |
| 2  | 3  | 0  | 1  |
| 6  | 7  | 4  | 5  |

| h5  | h6  | h7  | h4  |
|-----|-----|-----|-----|
| h9  | h10 | h11 | h8  |
| h13 | h14 | h15 | h12 |
| h1  | h2  | h3  | h0  |

4x4x3 Hyper Code

*Fig. 9*

4x4x3 Hyper Code

ENHANCED TURBO PRODUCT CODES

RELATED APPLICATIONS

This Patent Application claims priority under 35 U.S.C. 119(e) of the U.S. Provisional Patent Application, Ser. No. 60/189,345 filed Mar. 14, 2000, now abandoned, and entitled "ENHANCED TURBO PRODUCT CODES". The Provisional Patent Application, Ser. No. 60/189,345 filed Mar. 14, 2000, and entitled "ENHANCED TURBO PRODUCT CODES" is also hereby incorporated by reference.

BACKGROUND OF THE INVENTION

The present invention relates to enhanced turbo product codes (eTPCs), in general, and in particular, a method for encoding hyper-product codes by diagonal encoding and an apparatus for doing the same.

A product code is a concatenation of two or more block codes C1 and C2, each having parameters (n1, k1, d1) and (n2, k2, d2) where n is the codeword length, k is the number of information bits and d is the minimum Hamming distance. The product code P=C1×C2 is obtained by placing k1×k2 information bits in an array of k1 rows and k2 columns. Following, the k1 rows are coded using code C1 and n2 columns are coded using C2. Thus, the resulting product code is (n1×n2, k1×k2, d1×d2). Under such construction, all rows of the matrix P are codewords of C1 and all columns of matrix P are codewords of C2. Product codes can be two dimensional or multi dimensional. However, when the dimensions of the product become higher, codes with larger euclidean distances (dmin) are more easily obtained, but at a cost of significant increase in block size.

Turbo Product Codes (TPCs) is a class of codes that offer performance closer to Shannon's limit than traditional concatenated codes. TPCs are the iterative soft decision decoding of a product code. TPCs are a class of codes with a wide range of flexibility in terms of performance, complexity and code rate. This flexibility allows TPCs to be used in a wide range of applications.

An enhanced turbo product code is a code built with a TPC base. The base code can be any number of dimensions and may contain parity and/or extended Hamming constituent codes. When all axes of the code contain parity only constituent codes, the codes is a "hyper product code". Enhanced turbo product codes (eTPCs) include the N dimensional product of extending Hamming codes and simple parity codes followed by an additional parity calculation which is computed along a "hyper diagonal", where the product code has one or more dimensions. ETPCs admit a low-complexity implementation and can be iteratively decoded with a soft-in soft-out (SISO) algorithm.

To move from the base TPC to an eTPC, the bits in the base code are shuffled or interleaved according to a predetermined pattern. The parity is then computed over the new shuffled array. The parity is computed such that one additional row of bits is added to a 2-D TPC, or one additional plane is added to a 3-D TPC. This can be generalized to more dimensions since a n−1 dimensional structure of parity bits is added to the code where "n" is the dimension of the base code.

In addition to bit error rate performance improvement, eTPCs also have value in terms of flexibility. System designers generally required a variety of block sizes and code rates when developing a system employing error correction. The ability to use the entire set of eTPCs (including turbo product codes, enhanced turbo product codes and any combination thereof) give great flexibility in choosing an exact code for a given system.

The code rate and Best Error Rate (BER) performance of TPCs is dependent on the systematic, constituent block code codewords and the number of axes in the product code. The set of eTPCs shown below include codes of 2 or more dimensions, where the base code on each axis can include extended Hamming codes and/or parity codes or other equivalents. The table below shows the set of 2-D and 3-D eTPC code configurations:

| Code Configurations | Estimated Minimum Distance |
| --- | --- |
| PP | 4 |
| PP+ | ~6 |
| HP | 8 |
| HP+ | ~10 |
| HH | 16 |
| PPP | 8 |
| PPP+ | ~12 |
| HPP | 16 |
| HPP+ | ~20 |
| HH+ | ~20 |
| HHP | 32 |
| HHP+ | ~40 |
| HHH | 64 |
| HHH+ | ~80 |

In the table above, an 'H' represents an extended Hamming code axis, a 'P' represents a parity only axis, and a '+' indicates a enhanced turbo product code containing the additional hyper-diagonal axis. For example, a HP+ code contains an extended Hamming code in the X axis, a parity only code in the Y axis and an additional hyper-diagonal axis. The minimum distance for codes containing the hyper-diagonal axis depends on the length of the code axis and must be found by computer analysis. The table shows an estimate of the minimum distance for these codes in the right column. It is shown in the above table that the minimum distance for the codes increases as more axes of the code are coded. In addition, the minimum distance of the codes also increase as a hyper-diagonal axis is added to the code. In turn, the code rate in encoding the code decreases, which increases the performance of the encoder.

The diagonal parity bits or hyper-diagonal is obtained by adding bits diagonally along the block by using the following equation:

$$P_i = \sum_{k=0}^{m_1-1} B_{i+k,k} \qquad (1)$$

where $B_{i,j}$ is the (i,j)th product code bit. The diagonal parity bits can be generated by right "rotating" the $i^{th}$ row of the original product by i+1 bits, then adding each column to get the diagonal parity bits. Likewise, diagonal parity bits can also be generated by left rotating the $i^{th}$ row of the original product code by i−1 bits, then adding each column to get the diagonal parity bits.

The addition of the diagonal parity bits increases the minimum Euclidean distance, dmin, of the code. The diagonal axis is often referred to as a hyper axis even when it is used with Hamming codes in the various axes. The increased minimum distance will result in a lower error floor of the code. Further, the addition of a hyper axis can improve the performance of the code before the bound.

A prior art method of encoding is to place the data in a kx×ky (kx, ky) array of bits. FIG. 1 generally illustrates the method of encoding in accordance with the present invention. The x-axis of the code is encoded by an x-axis encoder 10 which encodes each row resulting in a block of data having ky rows of nx bits per row (nx, ky). This block of data is input to a Y axis encoder 11 that encodes each column by adding data to the Y axis, resulting in a (nx, ny) block output. The last step includes a hyper axis encoder 12 which adds the diagonal parity bits to the code. Then, a parity only encode is applied to all columns of the block. The result adds one row to the block, resulting in a (nx, ny+1) output block.

The prior art method of encoding has several disadvantages. One full encoded 2-D block having a code (nx, ny) of storage is required in the encoder to hold both the data array and the error correction coding (ECC) bits. In addition, the encoder has a one block latency. Latency is defined as the time between the first bit of a block of data is input into the encoder and the last bit of the same block is output from the encoder. The prior art encoder have a high latency, because the encoder cannot output the data array until it finishes encoding both rows and columns. To complete this encoding process, the encoder must receive the entire data array. Therefore, the first data bit of the block cannot be output until the last data bit of the same block is input making the latency one full block. Many communications type systems cannot handle high latency because of the Quality of Service constraints placed on the system. For example, a ½ second delay on a telephone line is undesirable, because the delay inhibits communication between the transmitting and receiving ends.

What is needed is an efficient hardware implementation and method thereof of iterative encoding for eTPCs with a hyper diagonal parity array added, where the eTPC includes systematic bloc code codewords such as extended Hamming codes, parity codes as well as other codes. Using eTPCs with iterative diagonal encoding and decoding is advantageous, because such eTPC have an error floor of three to five orders of magnitude lower than the corresponding turbo-product codes.

What is also needed is an encoder than can encode the data 'on the fly' without storing the entire block in storage. Such an encoder should have very low latency because it would not store the data bits, but only store the error correction bits. The data bits would be transmitted immediately over the channel, making the latency near zero. In addition, such an encoder would have smaller storage requirements, because the encoder is not storing the data array itself.

SUMMARY OF THE INVENTION

A method of encoding a block of data having n dimensions. The block contains a plurality of systematic block code codewords, whereby the method comprises the steps of performing a parity calculation along a hyper diagonal in the block, wherein a parity result for the parity calculation is generated. Also, the step of adding the parity result to the block of data.

A method of encoding a n-dimensional block of data having a plurality of (n−1) dimensional sub-blocks. Each sub-block including a plurality of systematic block code codewords. A parity sub-block is added to the block of data, the parity sub-block having a plurality of parity bits, the method comprising the steps of causing the parity sub-block to be equal to a first sub-block rotated by a predetermined number of bits. Also, for each subsequent sub-block parallel to the first sub-block in the n-dimensional block, bit-wise XORing that parallel sub-block with the parity sub-block, wherein the parity sub-block is rotated by an appropriate number of bits.

A method of encoding a block of data having n-dimensions received from an input source. The block contains a plurality of information bits, the method comprising the steps of receiving a row of the block and immediately outputting the row. Encoding the information bits in the row, wherein a first set of encoded data is generated according to a first encoding scheme. Outputting the first set of encoded data. Encoding the information bits in a column according to a second encoding scheme, wherein a second set of encoded data is generated and iteratively updated according to the information bits in the row. Hyper-diagonally encoding the information bits in the block according to a parity encoding scheme, wherein a hyper set of encoded data is generated according to the information bits in the row and column and the first and second sets of encoded data. Outputting the updated second set of encoded data after all the information bits and all subsequent first sets of encoded data are outputted. Outputting the hyper set of encoded data.

An encoder for encoding a block of data having a plurality of information bits. The encoder outputs the information bits immediately after receiving the information bits, the encoder comprising a first encoder module for encoding the information bits in a row of the block, wherein the first encoder generates a set of encoded row bits. A second encoder module for encoding the information bits in a column of the block, wherein the second encoder module generates a set of encoded column bits according to the information bits in each row. The second encoder updates the encoded column bits for each row encoded by the first encoder. A hyper encoder module for hyper-diagonally encoding all information bits and all encoded bits diagonally along the block. The hyper encoder generates a set of parity results, whereby each parity result corresponds to a diagonal of the encoded bits.

An encoder for encoding a block of data into an encoded block of data. The block of data having a plurality of information bits arranged in a plurality of rows and columns, the encoder comprising: means for receiving the block of data, wherein the information bits received are immediately output by an output means. First means for encoding each row according to a first encoding scheme, wherein the first means generates a row encoding result for each row encoded by the first encoding scheme. Second means for encoding each column according to a second encoding scheme, wherein the second means generates a column encoding result for each column encoded by the second encoded scheme. The column encoding result is iteratively updated for each row encoded by the first means. Means for hyper-diagonally encoding along the encoded block of data, the means for hyper-diagonally encoding generating a hyper parity result for each corresponding diagonal in the encoded block of data.

An encoder for encoding a block of data into an encoded block of data, the block of data having a plurality of information bits. The encoder outputs the information bits immediately after receiving the information bits, the encoder comprising a first encoder module for encoding the information bits in a row of the block, wherein the first encoder generates a set of encoded row bits. A second encoder module for encoding the information bits in a column of the block, wherein the second encoder module generates a set of encoded column bits according to the information bits in each row. The second encoder updates the encoded column bits for each row encoded by the first encoder.

Other features and advantages of the present invention will become apparent after reviewing the detailed description of the preferred embodiments set forth below.

BRIEF DESCRIPTION OF THE DRAWINGS

FIG. 9 illustrates a three dimensional enhanced turbo product code in accordance with the present invention.

DETAILED DESCRIPTION OF THE PREFERRED EMBODIMENT

The method for encoding a enhanced turbo product code (eTPC) using hyper-diagonal encoding is shown in the following example. The following diagram illustrates a base 2-D parity only code along with lettering showing the order of the parity computation, whereby each letter in the block represents one bit. Specifically, the parity block shown in the diagram has parameters of (5,4)×(6,4). Thus, the data in the block is consists of 4 rows and 4 columns of data, each row and column having 4 bits within. Since the block is an eTPC block, error correction bits such as extending Hamming codes or parity codes are added to each row and each column to have a block consisting of 5 rows and 5 columns. In addition, a hyper parity row or array may be added to the eTPC block as part of the block or separately. The hyper parity array contains the results of the hyper-diagonal parity calculation of the entire encoded eTPC block, which includes the information bits in the 4×4 block as well as the ECC bit←

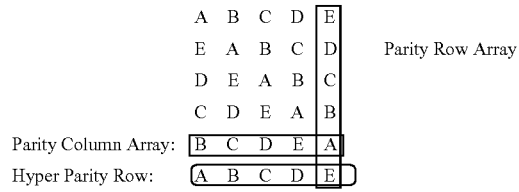

All the bits above have the same letter (A through E) which are used to compute the added parity bits which are to be placed in the hyper parity row. For example, all bits labeled A and will have even parity and all bits labeled B will have even parity, etc. Three dimensional hyper diagonal parity bits are added by moving through all three axes of the 3-D array. Similarly, any numbers of dimensions can be built. In the above diagram, the encoder performs the hyper diagonal by "rotating" the parity row after performing the parity calculation along a diagonal string of bits in the data block. For example, the encoder performs the parity calculation by diagonally traversing a string of bits A and positions the parity row to the right one column. Following, the encoder performs the parity calculation by diagonally traversing a string of bits B and positions the parity row to the right one column. This continues until the encoder performs a parity calculation for all the strings. Thereafter, the encoder rotates the parity row to the right one column, which results in the parity row in the diagram above. Other methods of hyper encoding may be used. For the 2-D code above, the hyper-diagonal parity results can be computed moving down and to the left instead of down and to the right. In addition, multiple rows of additional parity can be added to the code.

Figure 1:
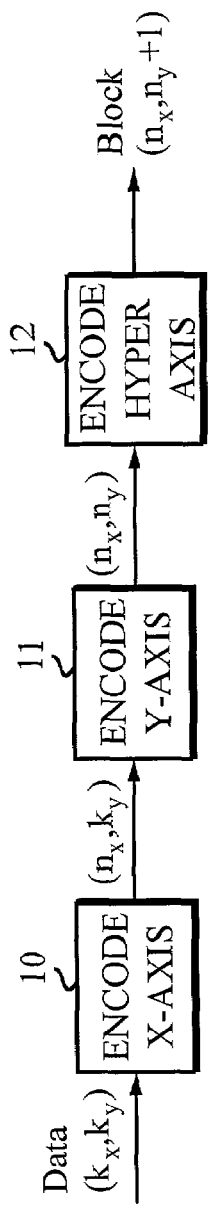
FIG. 1 illustrates a block diagram of an encoding method of a two dimensional code in accordance with the present invention.
Figure 2:
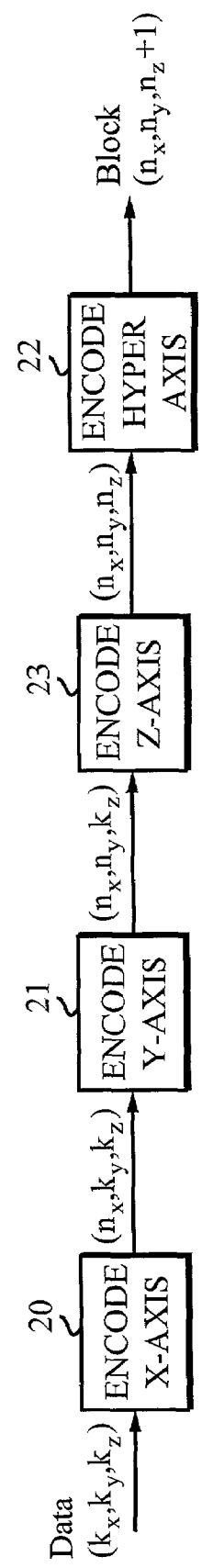
FIG. 2 illustrates a block diagram of an encoding method of a three dimensional code in accordance with the present invention.

The encoder can encode codes with higher dimensions by adding one array to the code. Thus a (16,11)×(16,11)×(16,11) may be encoded to be a (16,11)×(16,11)×(17,11) code. As shown in FIG. 2, the encoding is done in the same function as the 2-D case, except that an additional encoder is added between the "Encode Y-axis" 21 module and the "Encode Hyper Axis" 22 module. This module, labeled "Encode Z-axis" 23 executes the Z axis encoding. The block therefore is output as (nx, ny, nz+1).

Figure 3:
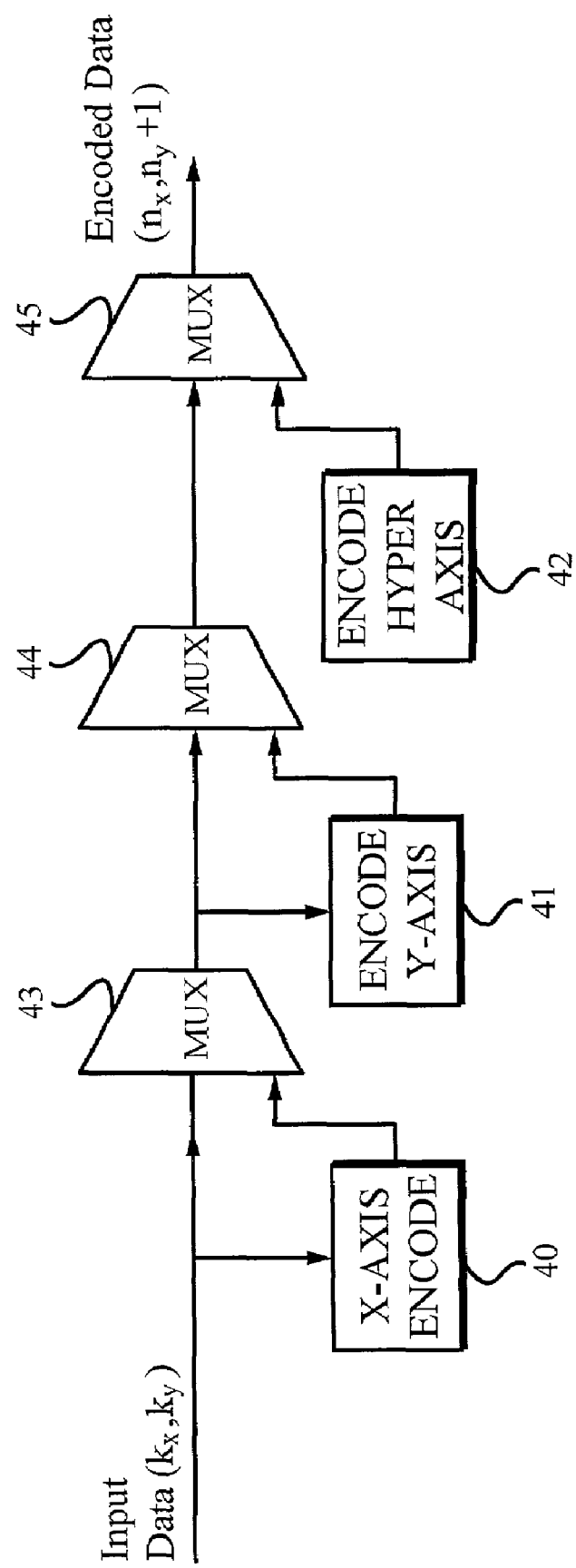
FIG. 3 illustrates a block diagram of an encoder of a two dimensional code in accordance with the present invention.

The encoder of the present invention uses a novel technique to limit the amount of storage space required for the encoding process and lower the latency of the encoder. A simplified block diagram of the present invention is shown in FIG. 3. Instead of placing the data in a kx×ky array of bits, the encoder 100 of present invention inputs each bit of a two dimensional block of data into the x_encoder 40, y_encoder 41, and hyper_encoder 42 and then passes out the encoded data to be transmitted. The x_encoder 40 contains n1−k1 bits of storage, where the code in the X axis is (n1,k1). The y_encoder 41 contains (n2−k2)×k1 bits of storage, and the hyper_encoder 42 contains n1 bits of storage.

The encoding of a two dimensional block of data proceeds as follows. The data for the first row of the block is input one or more bits at a time to each encoder and is immediately transmitted over the channel. The x_encoder 40 encodes the first row as the data is input. The y_encoder 41 encodes k1 parallel codes, each corresponding to one column (k) of the array. Finally, the hyper_encoder 42 encodes n1 parallel parity codes, each corresponding to one hyper-diagonal of the array.

After the entire first row of k1 data bits is input, the x_encoder 40 encodes the row by performing an encoding scheme, such as adding extending Hamming codes, parity codes, or any equivalent to the row. After the x_encoder 40 is finished encoding the first row, it is ready to output the first row of ECC bits or set of encoded data. The input data stream is halted while the mux 43 outputs the first row of ECC bits to the y_encoder 41 and the mux 44. Due to the halt of the data stream, the y_encoder 41 becomes idle during this time. When the first row ECC bits for the x axis is output, the memory in the x_encoder 40 is cleared by zeroing all bits in the memory of the x_encoder 40, and the next row of data is input into the x_encoder 40. The y_encoder 41 then encodes and iteratively updates each column by its own encoding scheme as each subsequent row of data is input to the encoder 100. Similarly, the hyper_encoder 42 updates by its own encoding scheme by encoding each hyper-diagonal parity bit as data enters the encoder 100.

This process iteratively continues until k2 rows are output from the encoder 100. Once k2 rows are output, the y_encoder finishes encoding all remaining column bits by performing a row by row parity calculation on all sets of encoded column bits. At this point, the y_encoder 41 is ready to output all y axis ECC data. The mux 44 is switched to allow y axis ECC data to be output from the encoder 100 while the x_encoder 40 continues to encode new code words and the hyper_encoder 42 continues to encode and update the data from the y axis ECC data. After n2 rows of the input data is encoded and output from the encoder 100, the y axis ECC data is exhausted. At this point, the memory of the y_encoder 41 is cleared by zeroing all bits in the memory of the y_encoder 41, and the hyper_encoder 42 has completed the hyper-diagonal encoding of the entire block. Following, the additional row of parity bits from the hyper_encoder 42 is output after the mux 45 is switched.

For a three dimensional block of data having (n, k, d) bits, z_encoder (not pictured) with a corresponding mux would be used to encode the d-planes of the data. The z_encoder encodes and iteratively updates each plane by its own encoding scheme as each initial and subsequent row is entered into the encoder 100. The z_encoder uses the encoded ECC data generated by the x_encoder 40 and y_encoder 41 to encode the bits in the plane. Although FIG. 3 illustrates that the rows are input first and the columns and hyper-diagonals are encoded according to the rows, it is not necessary for the method to occur in this manner. For example, the columns may be encoded first while the rows are updated, etc.

Figure 4:
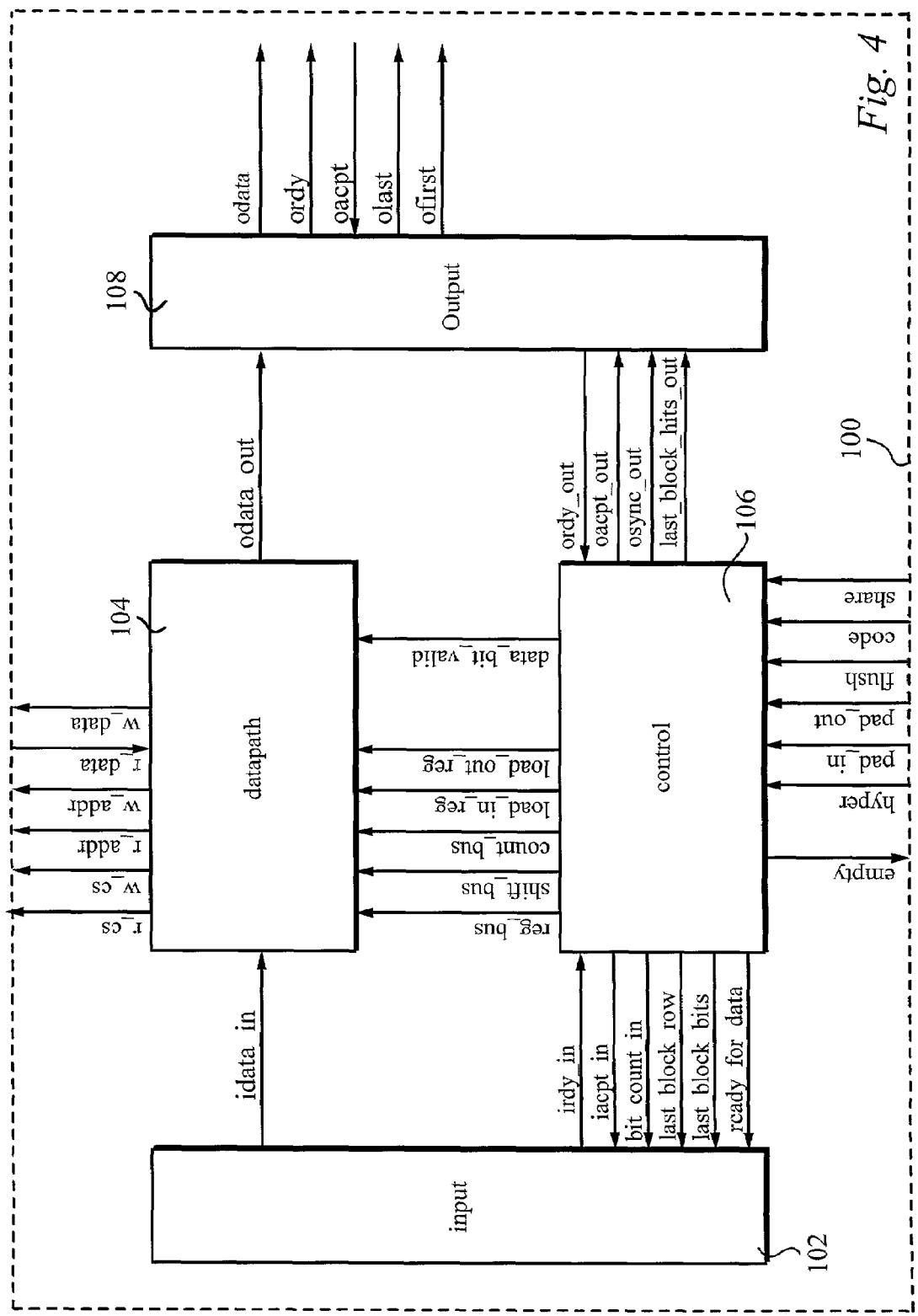
FIG. 4 illustrates a top level diagram of an encoder module in accordance with the present invention.

FIG. 4 illustrates a diagram of the encoder in accordance with the present invention. The 100 encoder includes four modules, namely the input module 102; datapath module 104; control module 106 and the output module 108. The input module 102 receives input data via a ready/accept handshake. The data is encoded within the datapath module and is then output through the output module 108 via ready/accept handshake. The control module 106 contains the encoder configuration settings, state machines and control signals used for the encoding. The output module 108 receives the encoded data from the datapath module 104 and control module 106 and outputs the encoded code.

The input module receives the input data at a rate of DATA_RATE bits at a time, where DATA_RATE is the value representing the number of encoded data bits processed per clock cycle. The value of the DATA_RATE cannot exceed the minimum number of encoded bits in the x-axis of the block. The input module 102 receives the input data and provides the required number of bits for the row being encoded. The number of data bits needed will depend on the encoding process and can be up to the value equal to the DATA-RATE bits. The input module 102 receives a last_block_bits signal and last_block_row signal from the control module 106 which informs the input module 102 when the last bits are to be received into the input module 102.

Figure 7:
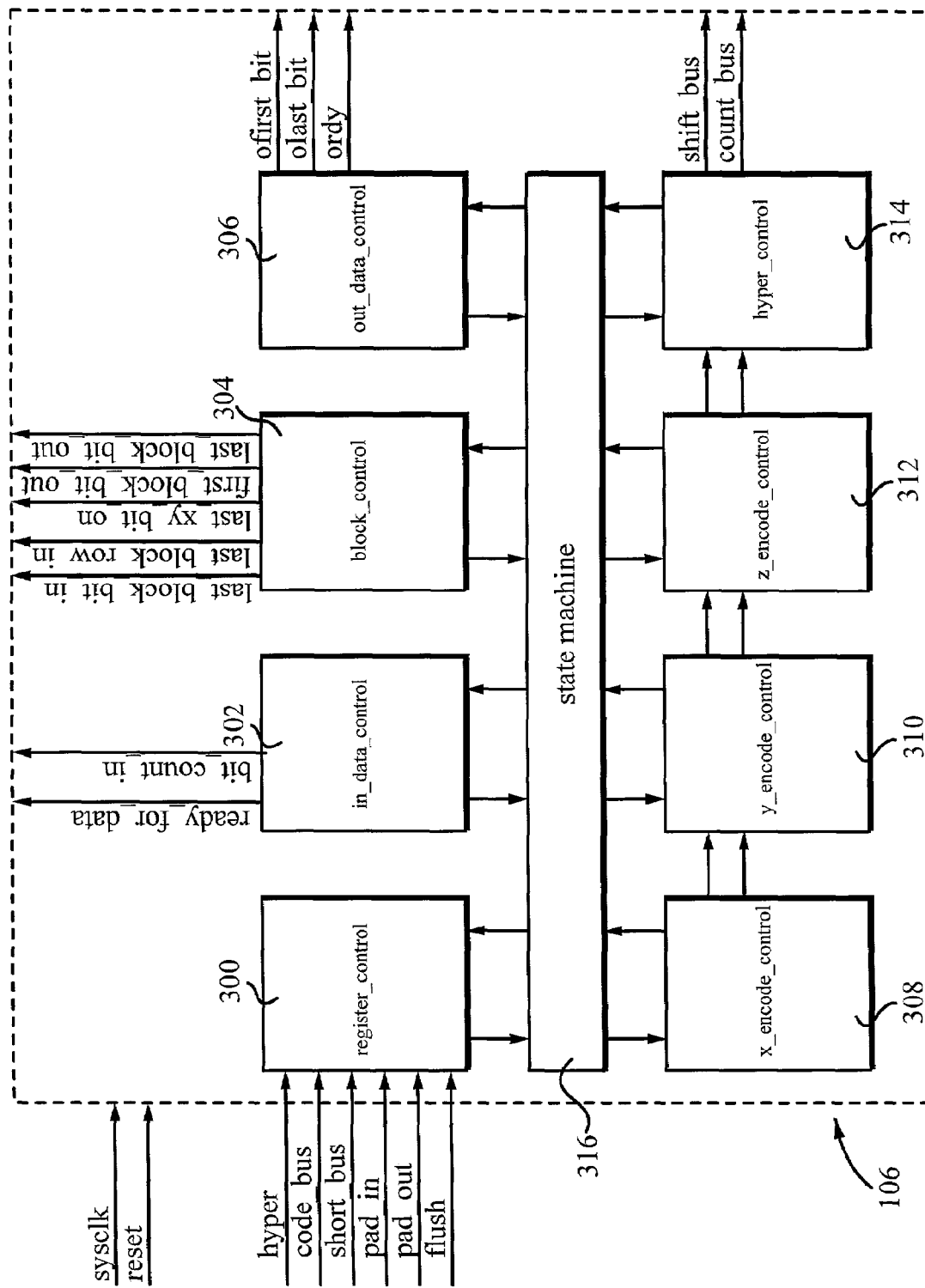
FIG. 7 illustrates a detailed diagram of a control module in accordance with the present invention.

The control module 106 contains control logic which allows the input, datapath and output modules communicate to one another in order to encode the data. The control module 106 is shown in more detail in FIG. 7 includes a register_control 300; in_data_control 302; block_control 304; out_data_control 306; x_encode_co y_encode_control 310; z_encode_control 312; and hyper_control 314. The register_control 300 registers all the input module control signals. The in_data_control 302 generates control signals used to receive input data from the input module 102. The block_control 304 generates control signals to specify the block status. The out_data_control 306 generates control signals used to output data from the output module 108. The x_encode_control 308 generates the control signals used for x-axis encoding done by the x_encoder 110. Likewise the y_encode_control and z_encode control generate the controls used for the y and z axis encoding done by the y_encoder 112 and the z_encoder 114, respectively. Further, the hyper_control signal are used for hyper encoding done by the hyper encoder 116. The output module 106 receives data at DATA_RATE bits per clock and sends the output data at DATA_RATE bits per clock. The data also contains a first_bit and last_bit flags that indicate the position of the first and last bits of the block.

The state machine 316 operates in an idle mode until a reset_n_pulse in provided. Once the reset_n_pulse is provided, the state machine 316 enters the active state and does not return to the idle state until another reset_n_pulse is given. When data is input, the state machine outputs either the data, x_encoded bits, y_encoded bits, z_encoded bits or the hyper bits.

Figure 5:
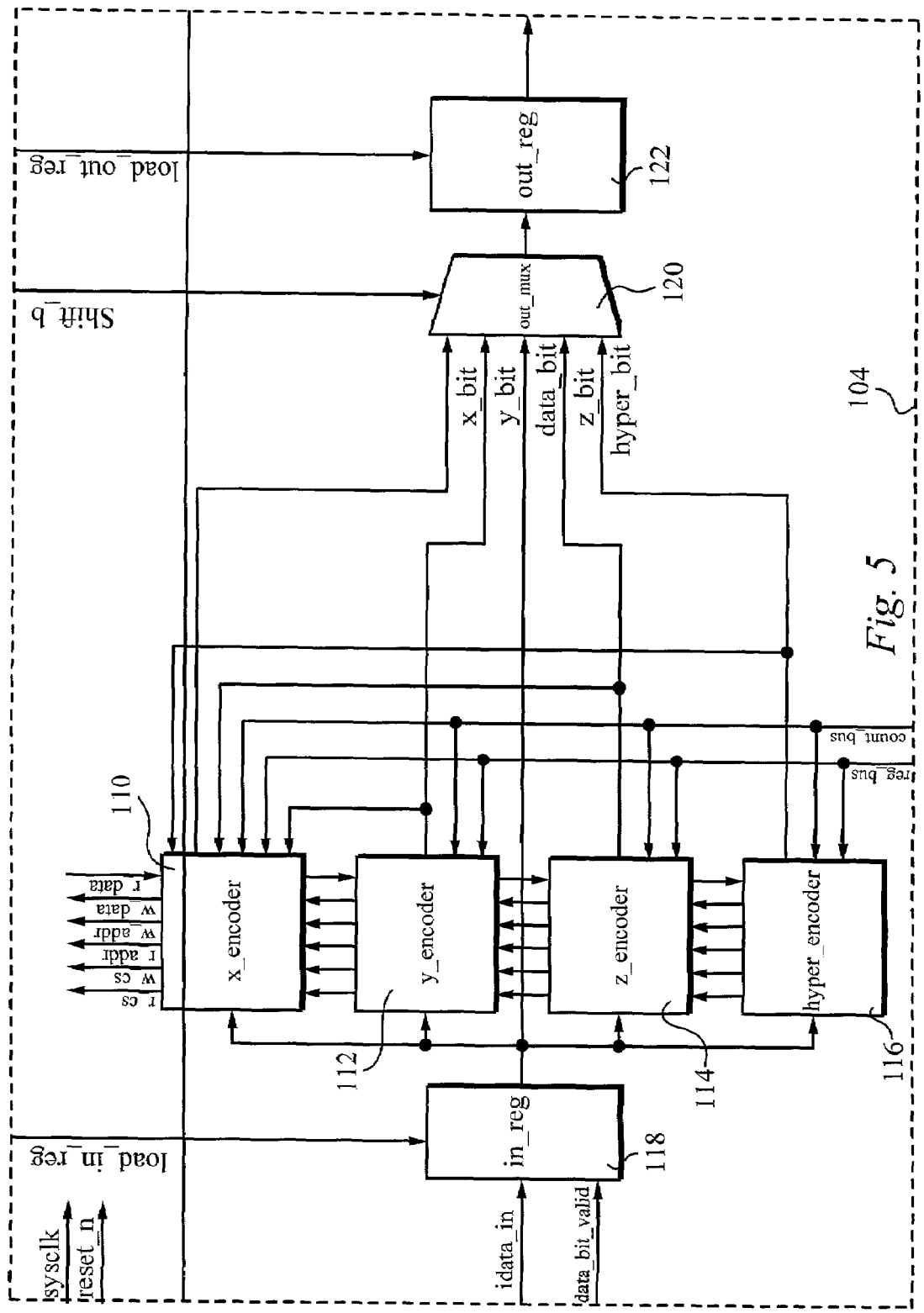
FIG. 5 illustrates a detailed diagram of a datapath module in accordance with the present invention.

The datapath module 104 in FIG. 5 performs the encoding functions, details of which are illustrated in FIG. 5. The datapath module 104 encodes a three dimensional block of data in the x,y, and z dimensions and adds the hyper bits when the datapath is enabled. This is done by four separate encoder, including an x_encoder 110, y_encoder 112, z_encoder 114 and a hyper_encoder 116. For a two dimensional block of data, the datapath module 104 would only use the x_encoder 110, y_encoder 112 and hyper_encoder 116. Each encoder examines the data stream and can output an independent encoded data stream out the path. The data gets clocked into the in reg register by a signal idata_in when the load_in_reg signal is active. The data is then sent to all of the encoder. The data is also sent to the output mux 120 as data_out. The output mux 120 either passes the data out or selects the data from one or all of the encoder to pass out to the out_reg register. The data is clocked into the out_reg register when the load-out reg signal is active. Each of the encoder can alternatively communicate to external memory over a RAM bus structure.

The x_encoder 110, y_encoder 112, and z_encoder 114 modules operate by Hamming code generator logic in addition to other logic which allows the encoder to add the systematic codewords on all data bits for the block of data. In an embodiment, the x_encoder 110 stores the Hamming and parity calculations in an internal register, such as a row encode storage array. For a DATA_RATE that is greater than 1, the Hamming calculation for DATA_RATE bits is done in parallel. For the y_encoder 112, a DATA_RATE equivalent to 1 causes the y_encoder 112 to store the Hamming calculation in an external memory, such as an external RAM or column encode storage array. However, a DATA_RATE greater than 1, the data is stored in an external memory as groups DATA_RATE wide. This requires only 1/DATA_RATE the number of addresses and DATA_RATE times the number of bits per address. The z_encoder 114 operates in the same way as the y_encoder 112 in that it stores the error correction bits in a plane encode storage array.

The hyper_encoder module 116 adds an extra row or column to a 2-D block or an extra plane of hyper bits to a 3-D block. The hyper bits are calculated by doing even parity along the diagonal axis of the block, and the resulting parity bits are stored in an external memory such as a parity array. All RAM address, data, and control signals are output on the RAM bus signals to the external memory. The y_encoder uses the least significant bits, the z_encoder, if present, will use the middle bits, and the hyper encoder uses the most significant bits.

The o_first signal will assert on the first bit of the block out. The o_last signal will assert in the last bit of the block out. For DATA_RATE greater than 1, both signals can be asserted at the same time. It will be up to the user to determine which bits in the bus are first and last bits.

Figure 6:
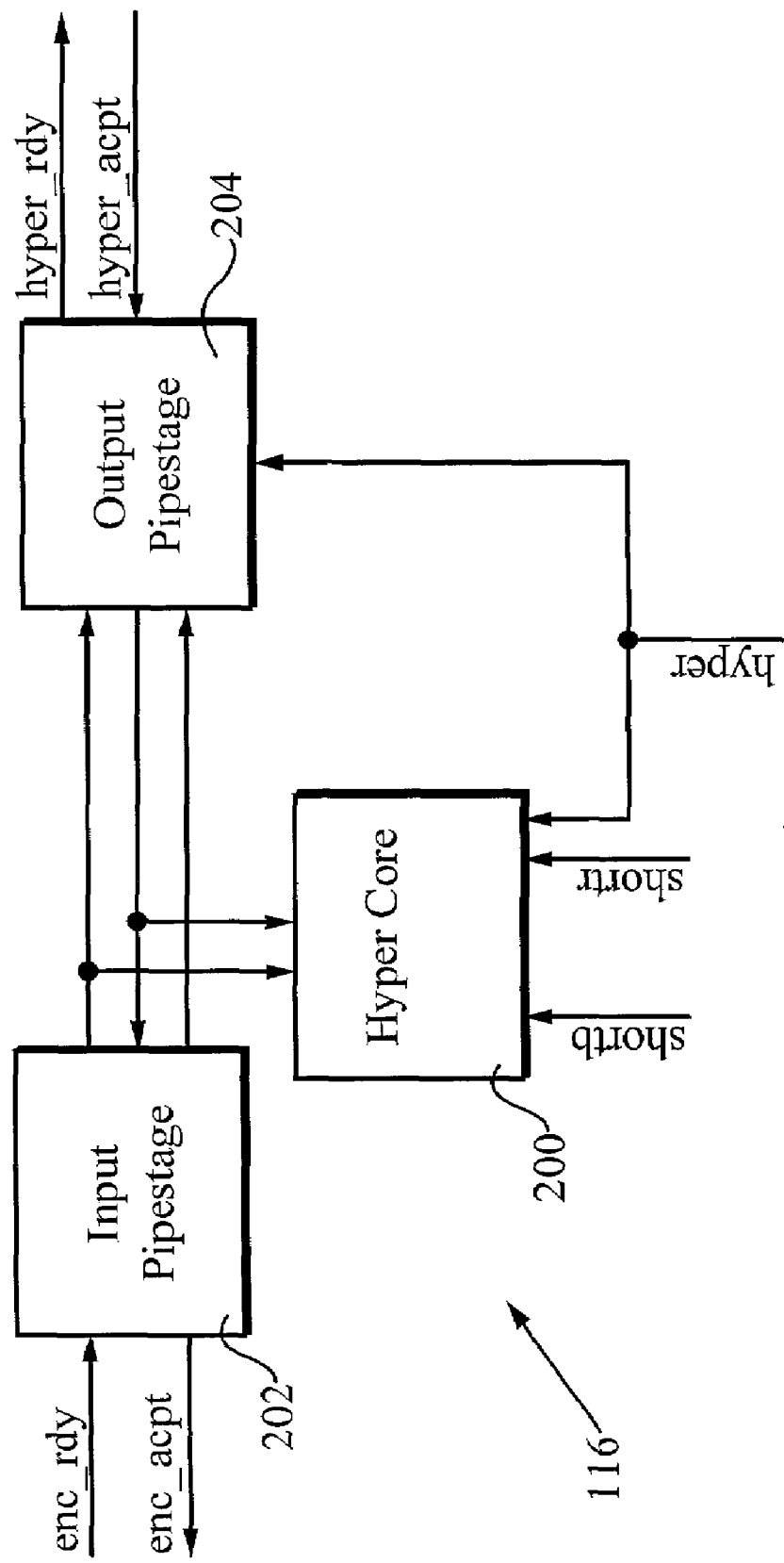
FIG. 6 illustrates a detailed diagram of a hyper_encoder in accordance with the present invention.

The hyper_encoder 116 traverses the diagonals in the input block and calculates the parity bits. FIG. 6 illustrates the details of the hyper_encoder 116 in accordance with the present invention. The hyper_encoder 116 includes a input pipestage 202, a hyper core 200 and output pipestage 204. The input pipestage 202 registers all the data for use by the other modules in the hyper_encoder 116. Data enters the hyper encoder through the input pipestage 202 via a ready/accept handshake, which is represented by enc_rdy and enc_accpt respectively. Similarly, the output pipestage 204 outputs data that is hyper encoded by a ready/accept handshake, which is represented by hyper_rdy and hyper_acpt respectively.

The hyper_core 200 has a hyper register or hyper array which is capable of storing a complete row. The hyper_core 200 includes a control module within which initiates all the RAM reads and writes. For 2-D enhanced turbo product codes, the registers can hold an entire row. Thus data is transferred between the previous row register and the hyper register. For a 3-D block, an entire hyper plane is stored in the hyper encoder. So, a RAM is used to hold the hyper plane parity bits. Thus, as data is transferred to the output pipestage 204, the row is built up in the hyper register. When the end of a row is reached, the row is written to the RAM. The input data is manipulated by positioning the previous row as discussed below and XORing with the input data. This data is then written to the RAM. During the entire first plane, the previous row is set to 0. The previous row is updated depending on which row it is in the plane. If the row is the last row in the plane, it receives the current data being written to the RAM. However, if the row is any other row in the plane, it receives the contents of the current RAM address to be written. There are exceptions. For example, during the first plane, the previous row is set to 0. Also, in the second plane, the regions that are within the shortr are set to 0. In theses cases, the previous row must be explicitly set to 0 to prevent the prior RAM contents from corrupting the hyper operation.

The hyper_encoder 116 calculates the parity along hyper-diagonals in a eTPC block. The traversal of the hyper-diagonals differ depending on the type of eTPC code. If the eTPC code is 2-D, there is one row of hyper parity bits added to the block as part of the block or separately. However, more than one row of hyper parity bits may be added to the block. In a 3-D eTPC code, an entire plane of hyper parity bits is added to block by the encoder 100.

The data is input starting from the upper left corner of a block. For the first row, the data is loaded into the hyper register at the output. At the end of the row, the data is XORed with the previous row register and stored into the previous row register. After the last DATA_RATE chunk of the eTPC block is transferred to the output, the data is transferred into the previous row register. Following, the result is transferred out to the output pipestage from the previous row register.

When a word is completely within the hyper_reg register, it is written to the RAM. The address is then incremented. When the last row of a plane is written, the address is reset to 0. During the first plane, only data is written, and all reads are ignored. During subsequent planes, data is read from the RAM, put into previous row registers, and the data in the hyper register is written to the same address. When the last word of the last row of the last plane is transferred into the output pipestage, the address is reset to 0. The word in the hyper register is immediately output. When the last word of the hyper register is output to the output pipestage, the address is incremented. At the end of every row of hyper bits output, the address is incremented. When the address reaches the y size, the output is finished.

It must be noted that although the encoder 100 is described encoding two and three dimensional codes, the encoder 100 may encoder data in higher dimensions and is thus not limited to the dimensions discussed above. For data being input into the encoder 100, where the data has more than three dimensions, the encoder 100 uses the above method to encode the sub-blocks of data, such as rows, columns, etc.

The encoder 100 also supports code shortening. For example, the number of x, y, and z rows to drop is specified with the shortx(), shorty(), and shortz() inputs. The shortb input can be used to shorten the block size by an additional number of bits, whereas the shortr input can be used to shorten rows on the first plane of the block. These inputs allow the encoder 100 to encode block sizes of any length. The bit shortening will be taken off the first bits of the first x row. The shorted bits will not be output in the data stream.

Since bits are shortened out in mixed amounts, the data input may not line up neatly in a block. Therefore, shortb and shortr are used to line the bits up within a block. Specifically, shortb represents a "bit shorten amount" signal which determines the number of bits in a row that must be shortened for a 2-D block. In 2-D enhanced turbo product codes, shortr must be set to 0. In addition, shortr represents a "row shorten amount" signal which determines the number of bits on the first plane to be shortened. For 3-D blocks, the value for shortr determines the number of rows to shorten off the first plane.

Figure 10A:
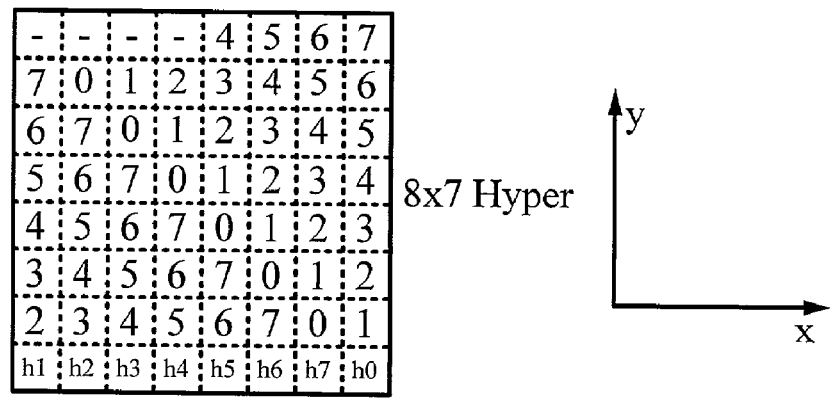
FIG. 10a illustrates a two dimensional enhanced turbo product code having shortened bits in accordance with the present invention.

The block in FIG. 10a illustrates the use of shortb in a 2-D enhanced turbo product code. The "-" in an a bit indicates shortened bits in the row, which are implicitly 0. For FIG. 10a, a "-" is placed in each row which is shortened, namely addresses 0-4 in row 1. The input data does not start at the upper left hand corner of the plane, but instead begins after the last "-" character. This impacts the encoding process by changing where the data is initially stored. However, since the parity row is initially set at zero in the first step of the hyper encoding, the initial location of the data does not change the results or output of the hyper parity check.

Figure 10B:
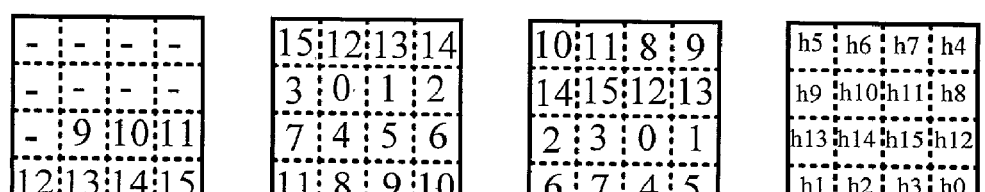
FIG. 10b illustrates a three dimensional enhanced turbo product code having shortened bits in accordance with the present invention.

The block in FIG. 10b illustrates the use of shortb and shortr in a 3-D enhanced turbo product code. Similar to the 2-D enhanced turbo product code with shortb, "—" characters are placed in the shortened rows and are implicitly 0. Again, input data is placed after the last "-" character, which changes where the data is initially stored. However, as in the 2-D block, the initial location of the data does not change the results or output of the hyper parity check, because the hyper parity plane is initially set to zero.

The are two counters that control the calculation of the hyper bits, namely hyper_index and addr. The hyper_index is used to build the input vector, whereas addr is the address to the RAM. Shortr and shortb are handled by preloading the counters. For shortb, the hyper_index register is used. The very first row of an incoming eTPC may be shortened by shortb bits. When an enc_start, which is the first word in an incoming codeword, is transferred with the data, the hyper_index register is loaded with shortb+1. The hyper_reg register is cleared will all zeros except where the DATA_RATE received bits are located. This causes the shortb bits to become all zeros. From this point, as bits are input, they are loaded into the hyper_reg. For subsequent rows, all loading is done starting with hyper_index set at 0.

For shortr, the addr_register is used. At the start, the address of the first word written is shortr. The RAM is filled starting from shortr. At the end of a plane, the address wraps around to 0. At this point, the addresses from 0 to short-1 do not hold data. All reads during the second plane are forced to 0. After the second plane, all address locations are valid. Addresses, are generated only for 3-D codes, not are not necessary for 2-D codes.

Figures 8A, 8B, 8C:
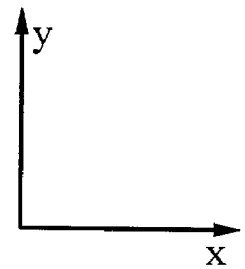
FIGS. 8a, 8b and 8c illustrate a two dimensional enhanced turbo product code in accordance with the present invention.

Having described the structure of the encoder 100 in accordance with the present invention, the functional aspect of the encoder 100 is now discussed. FIGS. 8a-8c illustrate several eTPC blocks of differing sizes. For 2-D blocks, the blocks include the bits along the diagonals that the parity is calculated for. The blocks shown in FIGS. 8a-8c contain extended Hamming codes that are illustrates a 7×7 block which becomes a 8×7 eTPC block after hyper encoding. FIG. 8b illustrates a 15×5 block which becomes a 16×5 eTPC block after hyper encoding. FIG. 8c illustrates a 4×8 block which becomes a 4×9 eTPC block after hyper encoding. In each figure, the numbers in each bit of the block represents the address number of the bit. Further, in each figure, the hyper bits are represented by the symbol "h" followed by the address number of each byte that the parity is calculated along. In each figure, each address in a row in the block is positioned to the right in the subsequent row (along the y-axis). The data is input to the block one row at a time, starting from the left hand corner of each block. The data is input exactly as it appears in FIGS. 8a-8c.

Data is input row by row starting in the first row wherein the data, after being encoded by the x_encoder 110, y_encoder 112, and z_encoder 114, contains extended Hamming code bits. After the last row is input for an array, the positioning procedure is performed on the subsequent arrays, such as rows or columns. To calculate the hyper parity bits for the eTPC block in accordance with the present invention, the following steps are preferably performed. 1. Set the parity row for the block is set to zero (0).

Thus, a 0 is placed in every bit in the parity row. 2. "Rotate" or position the parity row to the right by 1 bit address, which may be a row or column. 3. XOR the incoming bits with the parity row. 4. Store the result in the parity row. The process is repeated from step 2 until the result for the XORing of the last row with the parity row is placed in the parity row. Once the result for the last row is placed in the parity row, the parity row is preferably rotated by 1 to the right and the result is output.

These steps, however, do not have to necessarily occur in this order. Other combinations of the above steps in accordance with the present invention to encode the data may be performed to achieve the same result. It must also be noted that although the parity row is positioned by 1 to the right, the parity row may be positioned in any other direction. Further, the parity row is not limited to be rotated by 1 after each incoming row is XORed. Thus the parity row may also be positioned by more than two bit addresses or more.

FIG. 9 illustrates a diagram of a 3-D enhanced turbo product code. As in the previous figures for the 2-D enhanced turbo product code, the numbers in the blocks are bits addresses, and the numbers prefaced by "h" are the hyper diagonals. Unlike 2-D enhanced turbo product codes, the parity bits in a 3-D block are added as a plane to the block itself or as a separate plane. The first plane is represented as the block furthest to the left. Likewise, the second plane is second to the left and the third plane is shown to the right of the second plane. Further, the parity plane is farthest to the right. As in the 2-D enhanced turbo product code example, there is a positional relationship between the rows of the block. Preferably, in 3-D enhanced turbo product codes, the bits are positioned down one column and positioned to the right by 1 bit or column as the parity check proceeds along the z-axis. Thus, each row in each plane is positioned down in the subsequent row and to the right by 1 bit or column with respect to the previous plane. For each subsequent plane, the last row is moved up in the previous plane to the first row in the subsequent plane and moved to the right by 1 bit or column.

The process to determine the hyper parity bits for 3-D codes are set forth below. Data is input row by row starting in the first plane wherein the data, after being encoded by the x_encoder 110, y_encoder 112, and z_encoder 114, contains extended Hamming code bits. After the last row is input for a plane, the positioning procedure is performed on the subsequent planes. Preferably, the process for determining hyper parity bits are as follows: 1. Set the parity bits in the hyper plane to zero. 2. Rotate or position each row in subsequent plane to the right by 1 bit address, which may be a row or column. 3.

XOR the input plane with the hyper plane. 4. Store the result in the hyper plane. 5. Repeat steps 2-4 until the parity check is performed for the last plane. 6. Rotate or position each row in the hyper plane to the right by 1 bit address. 7. Output the plane.

These steps, however, do not have to necessarily occur in this order. Other combinations of the above steps in accordance with the present invention to encode the data may be performed to achieve the same result. It must also be noted that although the parity row is positioned by 1 to the right, the parity row may be positioned in any other direction. Further, the parity row is not limited to be rotated by 1 after each incoming row is XORed. Thus the parity row may also be positioned by more than two bit addresses or more.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modification s may be made in the embodiment chosen for illustration without departing from the spirit and scope of the invention.

What is claimed is:

1. A method of encoding a block of data having n-dimensions received from an input source, the block containing a plurality of information bits, the method comprising the steps of:
   receiving a row of the block and immediately outputting the row;
   encoding the information bits in the row by an X-axis encoder, thereby forming a first set of encoded data including a first parity data, wherein the first set of encoded data is generated according to a first encoding scheme and stored in a row encode storage array having a plurality of row array bits;
   outputting the first set of encoded data;
   resetting the row encode storage array after the first set of encoded data is output, wherein all row array bits are set to zero;
   encoding the information bits in a column by a Y-axis encoder according to a second encoding scheme, thereby forming a second set of encoded data including a second parity data, wherein the second set of encoded data is generated and iteratively updated according to the information bits in the row, and the Y-axis encoder is separate from the X-axis encoder;
   hyper-diagonally encoding the information bits in the block by a hyper-axis encoder according to a parity type encoding scheme, thereby forming a hyper set of encoded data comprising a plurality of hyper parity data values, each hyper parity data value is generated according to:
   the information bits in the row,
   the information bits in the column,
   the first parity data, and
   the second parity data,
   wherein at least one information bit in the row is located in a different row for the hyper set of encoded data than in the block, and the hyper-axis encoder is separate from the X-axis encoder and the Y-axis encoder;
   outputting the second set of encoded data after all the information bits and all subsequent first sets of encoded data are outputted; and
   outputting the hyper set of encoded data.

2. The method of claim 1, wherein the second set of encoded data is encoded according to the first encoding scheme.

3. The method of claim 1, wherein the second set of encoded data is encoded according to the second encoding scheme.

4. The method according to claim 1 wherein the block of data is three dimensional, the block of data including a plane of encoded bits, wherein the plane is orthogonal to the row and the column.

5. The method according to claim 4 further comprising the steps of:
   a. encoding the information bits in the plane according to a third encoding scheme, wherein a third set of encoded data is generated and iteratively updated corresponding to the information bits in the row; and
   b. outputting the third set encoded data after all subsequent second sets of encoded data are outputted.

6. The method according to claim 4 wherein the hyper set of encoded data is stored in a hyper parity array, and the hyper parity array is a hyper parity plane.

7. The method according to claim 1 wherein the second set of encoded data is stored in a column encode storage array.

8. The method of claim 7 wherein the Y-axis encoder stores only the second parity data.

9. The method according to claim 1, wherein the hyper set of encoded data is stored in a hyper parity array, wherein the hyper parity array includes a plurality of parity array bits.

10. The method of claim 9, wherein the hyper-axis encoder stores only the hyper parity data values.

11. The method according to claim 9 wherein the step of hyper-diagonally encoding further comprises:
   a. updating the hyper parity array by iteratively encoding the parity array for the information bits and the first set and the second set of encoded data for each row; and
   b. rotating the hyper parity array, wherein rotating the hyper parity array comprises relocating a plurality of the parity array bits in the array.

12. The method according to claim 9 further comprising the step of initializing the hyper parity array such that all parity array bits are set to zero, wherein the step of initializing is executed before the information bits are encoded.

13. The method of claim 1, wherein the X-axis encoder stores only the first parity data.

* * * * *